United States Patent [19]

Satoh et al.

[11] Patent Number: 5,084,752
[45] Date of Patent: Jan. 28, 1992

[54] SEMICONDUCTOR DEVICE HAVING BONDING PAD COMPRISING BUFFER LAYER

[75] Inventors: Shinichi Satoh; Hiroji Ozaki; Hiroshi Kimura; Wataru Wakamiya; Yoshinori Tanaka, all of Hyogo, Japan

[73] Assignee: Mitsubishi Denki Kabushiki Kaisha, Tokyo, Japan

[21] Appl. No.: 538,817

[22] Filed: Jun. 15, 1990

[30] Foreign Application Priority Data

Oct. 17, 1989 [JP] Japan ................... 1-270972

[51] Int. Cl.⁵ ............................. H01L 23/48
[52] U.S. Cl. ...................... 357/68; 357/23.7; 357/54; 357/80; 357/59; 357/71
[58] Field of Search ............ 357/80, 84, 68, 70, 357/69, 23.6, 23.7, 59, 71

[56] References Cited

U.S. PATENT DOCUMENTS

| | | | |
|---|---|---|---|
| 3,772,575 | 11/1973 | Hegarty et al. | 357/80 |
| 4,121,240 | 10/1978 | Katto | 357/84 |
| 4,942,450 | 7/1990 | Iwashita | 357/84 |
| 4,958,222 | 9/1990 | Takakura et al. | 357/84 |
| 5,006,913 | 4/1991 | Sugahara et al. | 357/23.6 |

Primary Examiner—Andrew J. James
Assistant Examiner—T. Davenport
Attorney, Agent, or Firm—Lowe, Price, LeBlanc & Becker

[57] ABSTRACT

A semiconductor device includes a substrate (4) in a periphery of which are formed elements isolating regions. A bonding pad (3) is formed above the elements isolating region, with an isolation layer (7) provided therebetween. An underlying layer (12) having a buffering function is formed on a surface of the bonding pad and the semiconductor substrate. In one aspect of the invention, wherein the elements isolating region is formed of LOCOS film (30), the underlying layer is formed between the bonding pad and the LOCOS film. In another aspect of the invention, the elements isolating region is of a field-shield structure (13, 14), and the underlying layer (12) is formed by separating a part of a gate electrode layer (14) of the field shield into an island. The underlying layer buffers the structure against an external force that is applied on the bonding pad in a bonding processing, to thereby prevent generation of cracks in the semiconductor layer.

19 Claims, 8 Drawing Sheets

SEMICONDUCTOR DEVICE HAVING BONDING PAD COMPRISING BUFFER LAYER

BACKGROUND OF THE INVENTION

1. Field of the Invention

The present invention relates generally to semiconductor devices, and, more particularly, to an improvement of a structure of a peripheral region of a bonding pad by which cracks and leaks in a semiconductor device, particularly as may be generated in a bonding step, can be prevented.

2. Background of the Prior Art

FIG. 11 is a diagram of a layout of a random access memory chip shown as an example of a semiconductor device. A semiconductor memory device 1 has an integrated circuit such as a memory cell array 2 in its central region, and has a plurality of bonding pads 3 located in its peripheral region. The bonding pads 3 are electrode portions for lead connection for leading a signal from the inside of an element to the outside thereof. FIG. 12 shows a sectional structure of the peripheral portion including the bonding pad 3 taken along a cut line A in the semiconductor chip 1. FIG. 12 is a sectional view schematically showing a structure of a semiconductor integrated circuit. MOS transistors 5, 5 constituting an integrated circuit are formed on a major surface of a semiconductor substrate 4. The MOS transistors 5, 5 are insulated and isolated with a field oxide film 30 for element isolation provided therebetween. The major surface of the semiconductor substrate 4 is covered with a thick interlayer insulating film 7. In addition, a bonding pad 3 is formed at a predetermined position on the surface of the interlayer insulating film 7. Furthermore, a passivation film 8 is formed on the surface of the interlayer insulating film 7 on which the bonding pad 3 is formed. The passivation film 8 has an opening portion on the surface of the bonding pad 3. A wire 9 for connecting an external lead is welded on the surface of the exposed bonding pad 3.

A description will now be given of the bonding of a bonding pad and an external lead in the semiconductor chip 1. The bonding pad 3 is formed of aluminum (Al) or the like and the wire 9 is also formed of Al, Au or the like. There are various methods of wire bonding and, in general, a thermal and pressurized connection scheme or a supersonic scheme are often used. The wire bonding of the thermal and pressurized connection scheme is a method of connecting the bonding pad 3 and the wire 9 by applying heat and pressure. The supersonic wave scheme is a method of rubbing contact surfaces of the bonding pad 3 and the wire 9 to mechanically connect both the metals by pressing the wire 9 on the surface of the bonding pad 3 to vibrate the same. Accordingly, in these bonding methods, especially in the later method, both mechanical impact and pressure affect the surface of the bonding pad 3. The impact is propagated through the interlayer insulating film 7 under the bonding pad 3 to reach the field oxide film 30 or which further applies the impact on the surface of the semiconductor substrate 4 directly under the field oxide film 30. This deteriorates a crystalline structure of a surface region of the semiconductor substrate 4. In case the impact is stronger, a crack may be formed in the interlayer insulating film 7. Deterioration of the surface of the semiconductor substrate 4 and the formation of a crack 11 in the bonding step, as described, can cause such trouble as follows in a function test later:

a. An invention layer is formed between two MOS transistors 5, 5 isolated with the field oxide film 30 located directly under the bonding pad 3 provided therebetween to generate a conducting current 10.

b. A leak is generated between the bonding pad 3 and the semiconductor substrate 4 along the crack 11 formed from the bonding pad 3 toward the semiconductor substrate 4.

Since there is no means for restoring such a semiconductor chip, the chip is discard as defective. Therefore, yield in the manufacture of such semiconductor devices is reduced, resulting in a decrease of productivity.

On the other hand, there is another method of preventing the formation of crack or the like by reducing the pressure of the wire 9 onto the bonding pad 3 in the bonding step. However, this method is found to be difficult for the following reasons. FIG. 13 is a diagram showing a correlation between the pressure applied on the bonding pad and the adhesive strength of the wire, and the crack generation rate. First, in order to obtain reliability of adhesiveness between the bonding pad 3 and the wire 9, it is necessary to ensure constant adhesive strength $F_{WL}$. Namely, the pressure F onto the bonding pad is required to be $F_1$ or more. However, the crack generation rate C is increased approximately in proportion with the pressure F. Accordingly, in order to hold the crack generation rate below the allowable value $C_L$, the pressure F is required to be $F_2$ or below. Considering both the requirements of the pressure F, an applicable pressure F is limited in the range of $F_1 < F < F_2$ in the drawing. However, the range is limited to be very narrow in many cases because of a stacked layer structure, a material structure of the bonding pad 3 or the like of the device in practical use. In addition, a margin for the pressure should be counted. Accordingly, a method of suppressing the formation of crack and the like by adjusting the pressure onto the bonding pad in bonding is not perfectly effective means in practice.

SUMMARY OF THE INVENTION

An object of the present invention is to prevent the generation a of leak in a bonding pad region of a semiconductor device.

Another object of the present invention is to buffer external force applied to a bonding pad.

A further object of the present invention is to increase resistance to external force of a bonding pad portion.

A further object of the present invention is to provide a method of manufacturing a semiconductor device having a bonding structure in which no leak is generated.

A semiconductor device according to the present invention comprises a semiconductor substrate having a major surface in which a plurality of semiconductor elements are formed, and element isolating means formed on the major surface of the semiconductor substrate for insulating and isolating the plurality of semiconductor elements. In addition, bonding pads formed with an interlayer insulating layer provided therebetween are disposed at a predetermined position of the major surface of the semiconductor substrate. An underlying layer of a different material from that of the interlayer insulating layer is formed between the bonding pad and the major surface of the semiconductor substrate on which the element isolating means is located. The underlaying layer is formed so as to cover at least a region under the bonding pad.

A semiconductor device comprising an electrode layer for insulation and isolation formed on the major surface of the semiconductor substrate with an insulation film provided therebetween, an underlying layer with a periphery surrounded by the electrode layer for insulation and isolation and electrically maintained in a floating state, and a bonding pad formed above the underlying layer with an interlayer insulating layer provided therebetween is manufactured by the following steps.

First an insulation layer and a conductive layer are sequentially formed on the major surface of the semiconductor substrate.

Then the conductive layer and the insulation layer are patterned to form an electrode layer for insulation and isolation having an opening region of a predetermined configuration, and then an underlying layer is formed separated from the electrode layer for insulation and isolation in the opening region.

Then, after covering side surfaces and an upper surface of the electrode layer for insulation and isolation and the underlying layer, an interlayer insulating layer is formed over the surface thereof.

Then, a bonding pad is formed on a surface of the interlayer insulating layer located above the underlaying layer.

The underlying layer disposed between the bonding pad and the semiconductor substrate buffers the impact applied on the surface of the bonding pad in the bonding step and prevents damage of the surface of the semiconductor substrate and formation of cracks, thereby preventing generation of leaks caused by conduction between the elements on the surface of the semiconductor substrate and the formation of cracks between the interlayer insulating layers.

In addition, the underlying layer is formed by patterning a part of the conductive layer constituting the element isolating means. Accordingly, an underlying layer which is electrically in the floating state can be easily formed under a bonding pad.

The foregoing and other objects, features, aspects and advantages of the present invention will become more apparent from the following detailed description of the present invention when taken in conjunction with the accompanying drawings.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1A:
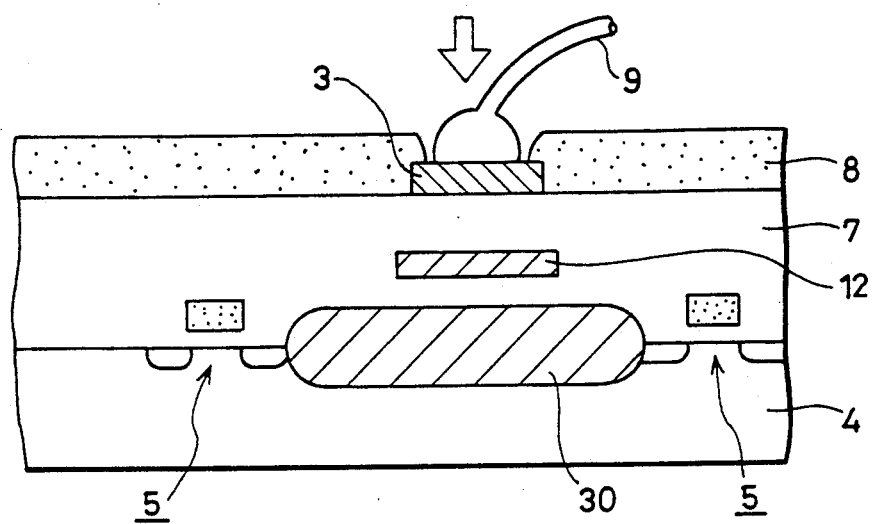
FIG. 1A is a diagram of a sectional structure of a periphery of a bonding pad of a semiconductor device according to a first embodiment of the present invention.
Figure 1B:
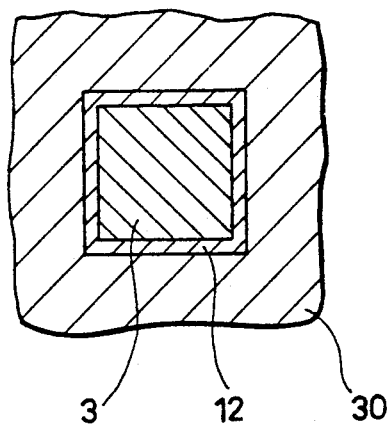
FIG. 1B is a diagram of a plane structure of the same.

First, the preferred first embodiment will be described. Referring to FIGS. 1A and 1B, in this example, shown is a field oxide film 30 formed by LOCOS (Local Oxidation of Silicon) method as a means for isolating elements. MOS transistors 5, 5 formed on a surface of a semiconductor substrate 4 are insulated and isolated with the field oxide film 30 provided therebetween. The surface of the semiconductor substrate 4 is covered with an interlayer insulation film 7. A bonding pad 3 formed of Al or the like is formed on the surface region of the interlayer insulation film 7 located above the field oxide film 30. Formed on the surface of the interlayer insulation film 7 is a passivation film 8 having an opening portion on the surface of the bonding pad 3. Then, an underlying layer 12 is formed between the bonding pad 3 and the field oxide film 30 in the interlayer insulation film 7. The underlying layer 12 is formed of, for example, such material as polycrystalline silicon or metal, and is configured so as to cover a projected portion under the bonding pad 3. More specifically, the underlying layer 12 is configured so as to cover a range through which mechanical impact passes which is applied from the bonding pad 3 on the semiconductor substrate 4, in bonding. The underlying layer 12 absorbs the impact applied on the bonding pad 3 in bonding and prevents the surface of the semiconductor substrate 4 from being damaged. The underlying layer 12 may be formed by patterning a part of conductive layers or interconnection layers of the semiconductor elements formed on the surface of the semiconductor substrate 4. Furthermore, a plurality of layers may be formed with the interlayer insulation film 7 provided between the bonding pad 3 and the field oxide film 30.

Figure 2A:
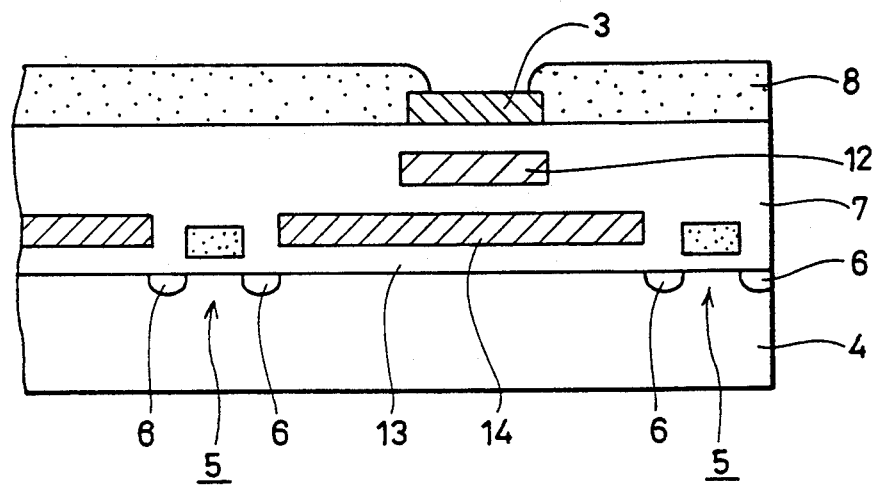
FIG. 2A is a diagram of a sectional structure of a periphery of a bonding pad of a semiconductor device according to a second embodiment of the present invention.
Figure 2B:
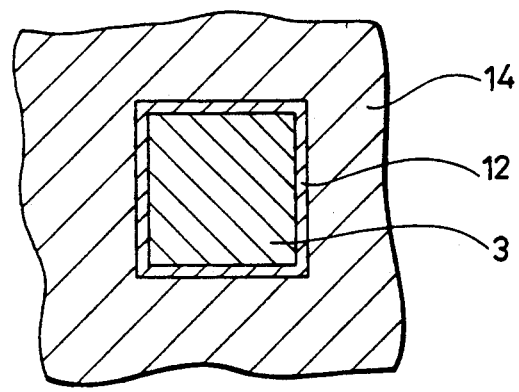
FIG. 2B is a diagram of a plane structure of the periphery of the bonding pad of the semiconductor device according to the second embodiment.

A second embodiment, best understood with reference to FIGS. 2A and 2B, will now be described. In this embodiment, a so-called field shield isolation structure is employed as a means for isolating elements. The field shield isolation structure comprises an electrode layer 14 for isolation formed between source/drain regions 6, 6 of two MOS transistors 5, 5 on a major surface of the semiconductor substrate 4 with an insulation layer 13 provided therebetween. Then, a voltage of 0 or a negative potential is applied to the electrode layer 14 for isolation used for a p type substrate or a p type well. Then, the two MOS transistors are insulated and isolated such that an inversion layer is not formed in the surface region of the semiconductor substrate 4 which is located directly under the electrode 14 for isolation. The bonding pad 3 is disposed above the electrode layer 14 for isolation with the interlayer insulation layer 7 provided therebetween. Then, the underlying layer 12 is provided between the bonding pad 3 and the electrode layer 14 for isolation. The underlying layer 12 is configured so as to completely cover a region under the bonding pad 3, as shown in FIG. 2B. The underlying layer 12 serves to buffer the impact in bonding as the first embodiment.

Figure 3A:
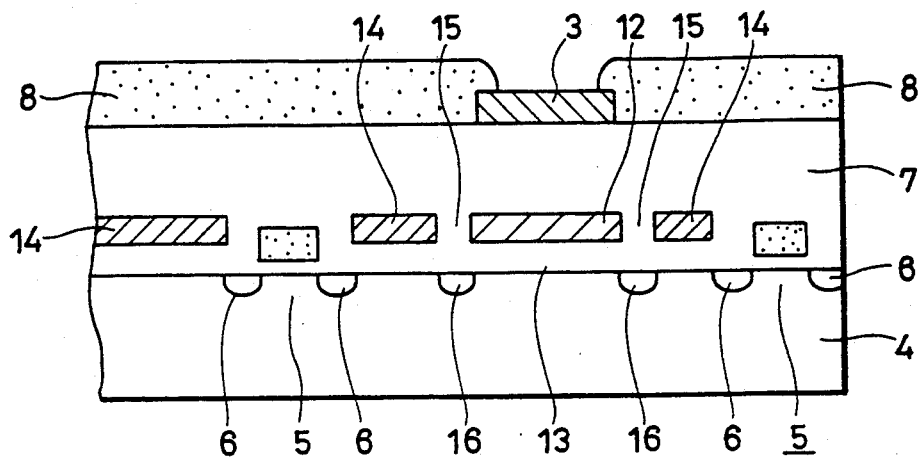
FIG. 3A is a diagram of a sectional structure of a periphery of a bonding pad of a semiconductor device according to a third embodiment of the present invention.
Figure 3B:
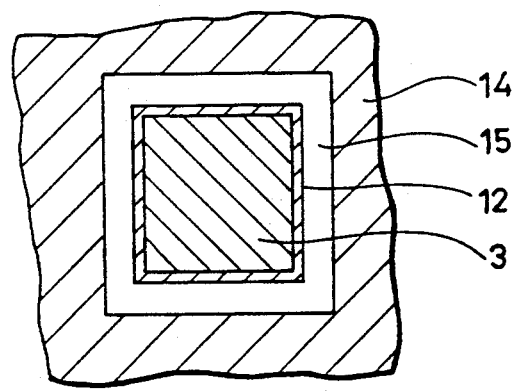
FIG. 3B is a diagram of a plane structure of the periphery of the bonding pad of the semiconductor device according to the third embodiment.

Now the third embodiment will be described with reference to FIGS. 3A and 3B. The third embodiment employs the field shield isolation structure as a means for isolating elements, similarly to the second embodiment. Island portions isolated by opening grooves 15 are formed in the electrode layer 14 for isolation of the field shield isolation structure. These island portions constitute the underlying layer 12. The underlying layer 12 is formed of polycrystalline silicon layer which is conductive, similarly to the electrode layer 14 for isolation. The underlying layer 12 may be formed by patterning a part of the electrode layer 14 for isolation or may be formed of a different layer from the electrode layer 14 for isolation. A high concentration impurity region 16 having the same conductivity type as that of the substrate is formed in a surface region of the semiconductor substrate 4, and which region is located below the opening grooves 15 between the electrode layer 14 for isolation and the underlying layer 12. The impurity region 16 is referred to as a channel stop region and serves to prevent the surface of the semiconductor substrate 4 directly under the electrode layer 14 for isolation being inverted to form a channel region. The channel stop region 16 is preferably provided, though it is not always required. In addition, the underlying layer 12 and the electrode layer 14 for isolation are insulated and isolated with the interlayer insulation layer 7 filled in the opening groove 15 provided therebetween. Accordingly, while a predetermined potential (0 or a negative potential) for isolating elements is applied to the electrode layer 14 for isolation, the underlying layer 12 is maintained in an electrically floating state. In addition, the bonding pad 3 is disposed above the underlying layer 12 with the interlayer insulation layer 7 provided therebetween.

In bonding, when the mechanical impact is applied on the bonding pad 3 onto the semiconductor substrate 4, the underlying layer 12 serves to buffer the impact. Now it is assumed that when the impact is larger, cracks are formed in the interlayer insulation layer 7 and leak is generated between the bonding pad 3 and the underlying layer 12. Even if such a state is brought about, the underlying layer 12 is in an electrically floating state separated from the electrode layer 14 for isolation or the semiconductor substrate 4 on the periphery thereof. Accordingly, generation of leak can be prevented between the bonding pad 3 and the semiconductor substrate 4 or the electrode layer 14 for isolation. Also in this embodiment, the underlying layer 12 is configured so as to fully cover at least a region under the bonding pad 3.

Now description is given of a method of manufacturing the semiconductor device shown in the third embodiment with reference to FIGS. 4A through 4G.

Figure 4A:
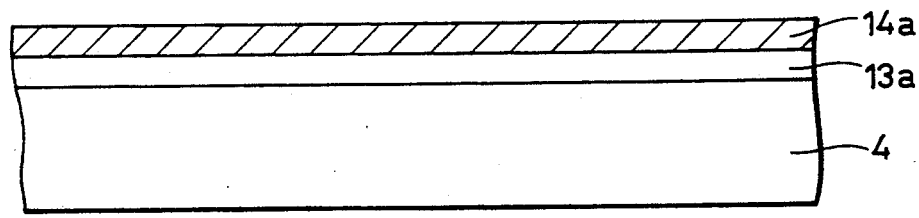
FIGS. 4A, 4B, 4C, 4D, 4E, 4F and 4G are sectional views showing a sequential step of manufacturing the semiconductor device shown in FIG. 3A.

First, referring to FIG. 4A, an insulation layer 13a of silicon dioxide or the like is deposited on the surface of the semiconductor substrate (silicon substrate) 4, and thereafter a polycrystalline silicon layer 14a is deposited on a surface of the insulation layer 13a.

Figure 4B:
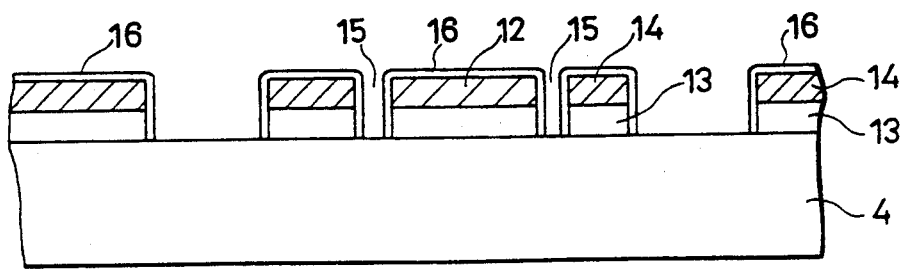

Now referring to FIG. 4B, the polycrystalline silicon layer 14a and the insulation layer 13a are patterned into a predetermined configuration using photolithography and etching methods. As a result, the electrode layer 14 for isolation and the underlying layer 12 are patterned. The underlying layer 12, with the opening groove 15 formed on a periphery thereof by etching, is formed separately from the electrode layer 14 for isolation. Subsequently, the isolation film 16 is formed on the major surface of the electrode layer 14 for isolation and the underlying layer 12. As a variation of this step, first, the electrode layer 14 for isolation is patterned to form an opening portion into a predetermined configuration. Furthermore, for example, a polycrystalline silicon layer is formed so as to cover the inside of the opening portion, and which is patterned to form the underlying layer 12. Thereafter, the insulation film 16 is formed.

Figure 4C:
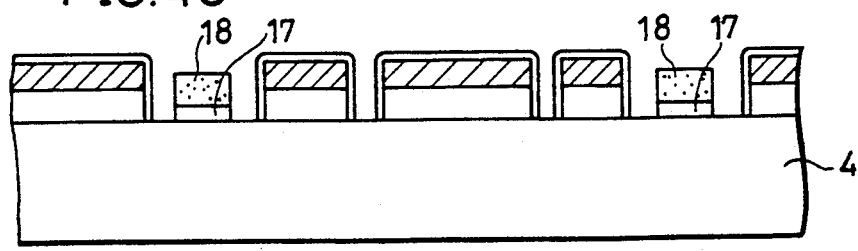

Now referring to FIG. 4C, a thin gate oxide film 17 and a polycrystalline silicon layer 18 are formed on the exposed surface of the silicon substrate 4 and patterned. As a result, a gate oxide film 17 and a gate electrode 18 of the MOS transistor 5 are formed.

Figure 4D:
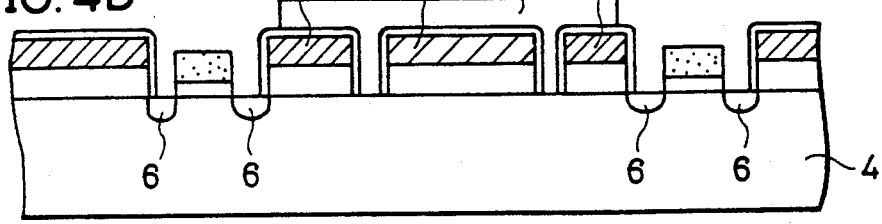

Thereafter, referring to FIG. 4D, the surface of the electrode layer 14 for isolation including the underlying layer 12 is covered with a resist 19. Impurity ion 20 of an opposite conductivity type to that of the substrate is implanted in the surface of the silicon substrate 4 to form source/drain region 6, 6, using the resist 19 and the gate electrode 18 as masks.

Figure 4E:
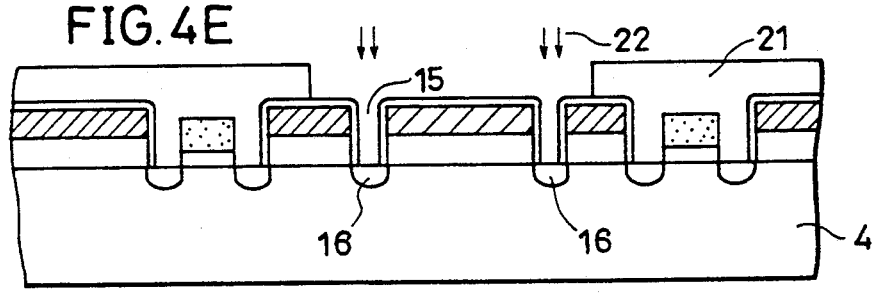

Then, referring to FIG. 4E, after the removal of the resist 19, another resist 21 having the inverted pattern to that of the resist 19 is now formed to expose a region of the electrode layer 14 for isolation. Then, impurity ion 22 of the same conductivity type as that of the silicon substrate 4 is implanted in the surface of the silicon substrate 4 exposed in the opening groove 15, using the resist 21 as a mask. This ion implantation forms channel stop layer 16.

Figure 4F:
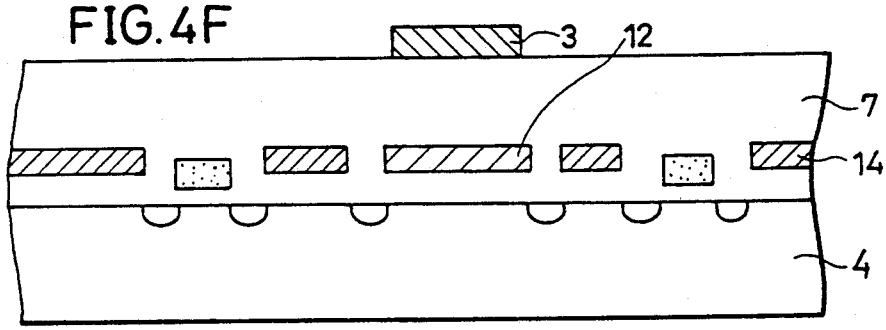

Thereafter, referring to FIG. 4F, after the removal of the resist 21, a thick interlayer insulation layer 7 is deposited on the whole surface. Then, a metal layer such as Al is deposited on the surface of the interlayer insulation layer 7 and patterned, thereby forming the bonding pad 3 in a region located above the underlying layer 12.

Figure 4G:
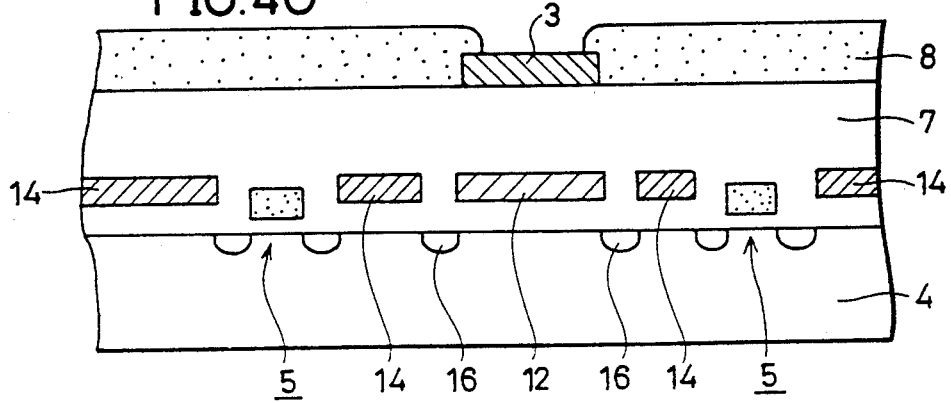

Then, referring to FIG. 4G, a passivation film 8 of silicon dioxide ($SiO_2$) or silicon nitride film ($Si_3N_4$ film) is formed on the surface of the interlayer insulation layer 7 on which the bonding pad 3 is formed. Then, the surface of the bonding pad 3 is exposed by removing the passivation film 8 on the surface of the bonding pad 3. By the above described steps, a semiconductor chip having integrated circuits is structured. Thereafter, the semiconductor chip is sealed in a package. As the foregoing, in the above described manufacturing steps, the underlying layer 12 can be formed by the same number of steps as those for manufacturing a semiconductor device of a conventional field shield isolation structure. While the channel stop layer 16 formed on the surface of the silicon substrate 4 between the underlying layer 12 and the electrode layer 14 for isolation is provided to securely prevent a formation of an inversion layer on the surface of the silicon substrate 4, it is not always required. Accordingly, the step of implanting the impurity ion 22 shown in FIG. 4E can be omitted.

Figure 5:
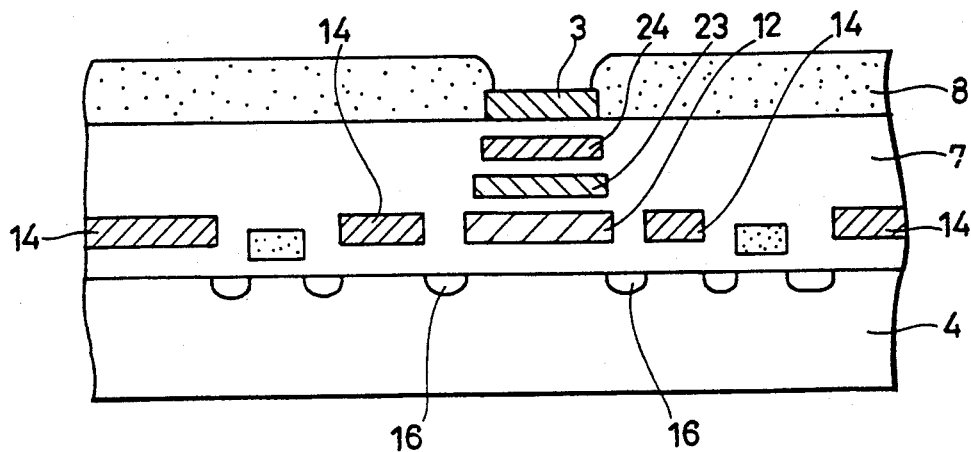
FIG. 5 is a diagram of a sectional structure of a peripheral region of a bonding pad of a semiconductor device according to a fourth embodiment.

Furthermore, the fourth embodiment will be described with reference to FIG. 5. The fourth embodiment is a variation of the third embodiment, and wherein a plurality of conductor layers (underlying layer) 23 and 24 are further formed between the bonding pad 3 and the underlying layer 12. The conductor layers 23 and 24 may be formed of polycrystalline silicon or metal layer for use in a step of forming a transistor or an interconnection layer. Then, the conductor layers 23 and 24 are configured to the bonding pad 3 or the underlying layer 12 so as not to be larger than the underlying layer 12. In this embodiment, the influence of the impact on the silicon substrate 4 can be fully eliminated because the conductor layers 23 and 24 and the underlying layer 12 absorb the impact in bonding. In addition, the conductor layers 23 and 24 as well as the underlying layer 12 are maintained in an electrically floating state with the silicon substrate 4 or the electrode layer 14 for isolation. Accordingly, even if the bonding pad 3 and the conductor layers 23 and 24 are rendered conductive due to crack or the like, it is possible to prevent them from being rendered conductive with the silicon substrate 4 and the like.

As a method of manufacturing the conductor layers 23 and 24, for example, a polycrystalline silicon layer may be used which are used for forming the gate electrode 18 of the MOS transistor. Furthermore, a polycrystalline silicon layer or a metal layer may be used which are for use in forming a signal line such as a bit line and a word line.

Figure 6:
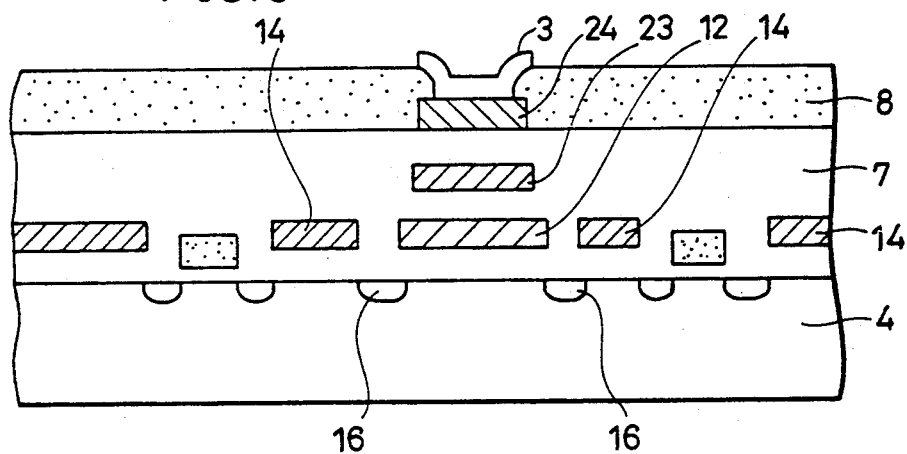
FIG. 6 is a diagram of a sectional structure of a variation of a periphery of a bonding pad of a semiconductor device according to a fifth embodiment of the present invention.

The fifth embodiment will be further described with reference to FIG. 6. The fifth embodiment is structured by a plurality of conductor layers formed above the underlying layer 12, the uppermost layer of which being connected directly to the bonding pad 3. Such a structure enhances the entire rigidity of the bonding pad 3. Accordingly, the impact applied on the bonding pad 3 in bonding is directly absorbed by the bonding pad 3 and the conductor layer 24 to produce an effect of reducing the influence to the underlying layer. Such a structure of the bonding pad 3 can be applied to the above described first through fourth embodiments.

Figure 7:
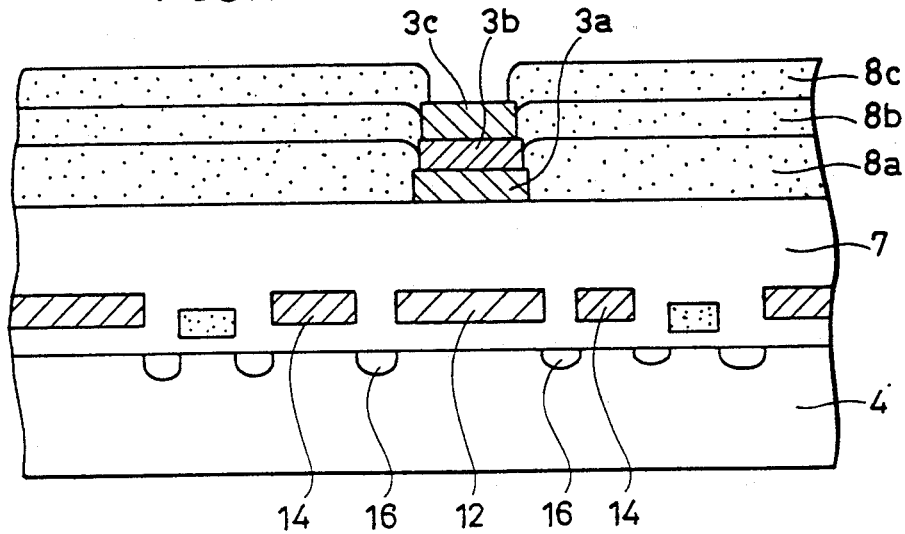
FIG. 7 is a diagram of a sectional structure of a variation of a bonding pad of a semiconductor device according to a sixth embodiment of the present invention.

The sixth embodiment will be described with reference to FIG. 7. The sixth embodiment is also related to a structure of a bonding pad. Namely, the structure comprises a plurality of metal layers stacked in a predetermined region on the surface of the interlayer insulation layer 7. In this example, shown is a structure of a bonding pad comprising three layers 3a, 3b and 3c. The bonding pads of the stacked layer structure are for enhancing the rigidity of the bonding pads themselves, thereby absorbing the impact in bonding. Accordingly, the bonding pad structure shown in this embodiment can be applied to the above described first through fourth embodiments. Since the respective layers of the bonding pads constituting the stacked layer structure are sequentially formed, in accordance thereto the passivation films are formed in a plurality of stacked layer structure comprising 8a, 8b and 8c.

While in the above described embodiment, the description is made mainly of a structure of a semiconductor chip, such a semiconductor chip as described above can be applied to semiconductor devices having various types of bonding structures which will be described in the following.

Figure 8:
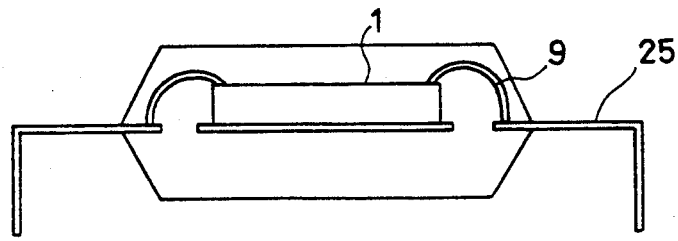
FIG. 8 is a diagram of a sectional structure of a semiconductor device of a wire bonding scheme to which a semiconductor chip according to the present invention is applied.

FIG. 8 is a sectional view showing a structure of a semiconductor device of a wire bonding system. The semiconductor chip 1 shown in the above described embodiment has the bonding pad 3 and a predetermined position of an external lead 25 bonded to each other by a wire 9 such as Al or Au. The thermal and pressurized connection scheme or the like is employed in the bonding step for the semiconductor device of the wire bonding scheme, as described above. Accordingly, the impact applied on the bonding pad 3 in bonding can be buffered effectively.

Figure 9:
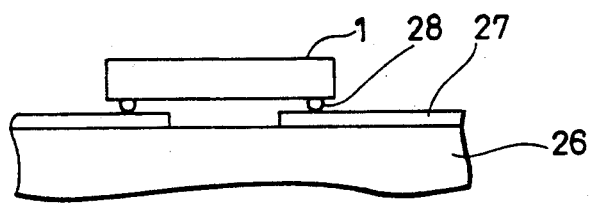
FIG. 9 is a diagram of a sectional structure of a semiconductor device of a flip chip scheme to which a semiconductor chip according to the present invention is applied.

FIG. 9 is a sectional view showing a structure of a semiconductor device having a bonding structure of a so-called flip-chip type which is packed in a circuit substrate. A predetermined interconnection pattern 27 is formed on a surface of a circuit substrate 26. A solder bump 28 is previously formed in a bonding pad portion of the semiconductor chip 1. Then, after a position of the bonding pad 3 in which the solder bump 28 is formed and an interconnection pattern 23 on the surface of the circuit substrate 26 are positioned, they are thermally pressurized and bonded to each other. Accordingly, also in this scheme, a mechanical compressive force is exerted on the bonding pad portion in bonding. Accordingly, a peripheral structure of the bonding pad of the above described embodiments is effective.

Figure 10A:
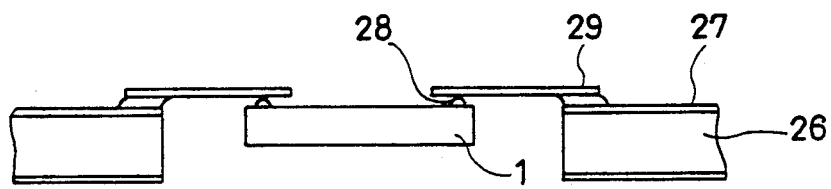
FIG. 10A is a diagram of a sectional structure of a semiconductor device of a tape carrier type to which a semiconductor chip according to the present invention is applied.
Figure 10B:
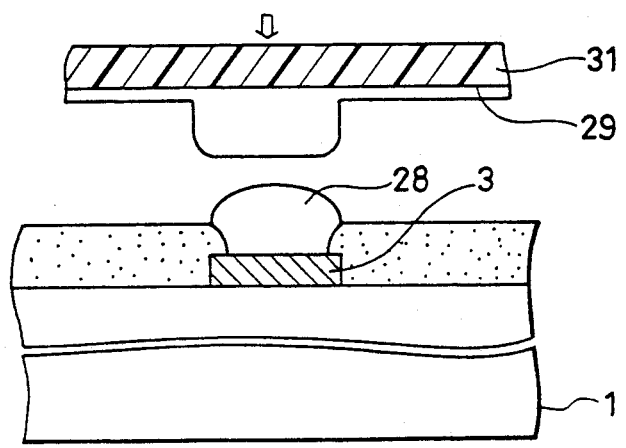
FIG. 10B is an enlarged diagram of a peripheral portion of a bonding pad of the semiconductor chip.
Figure 11:
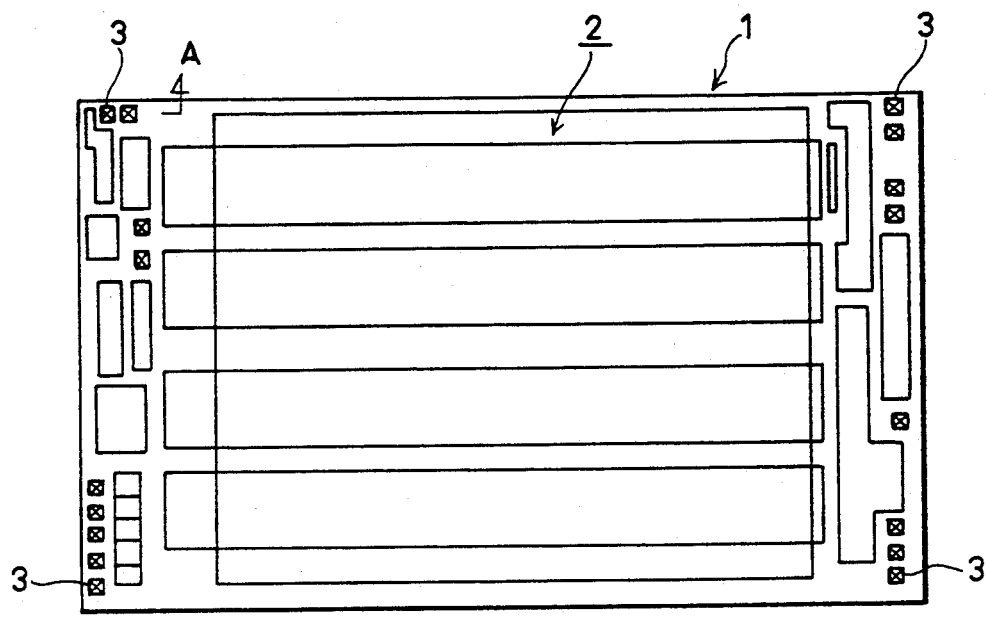
FIG. 11 is a diagram of a plane layout of a random access memory illustrated as an example of a semiconductor device.
Figure 12:
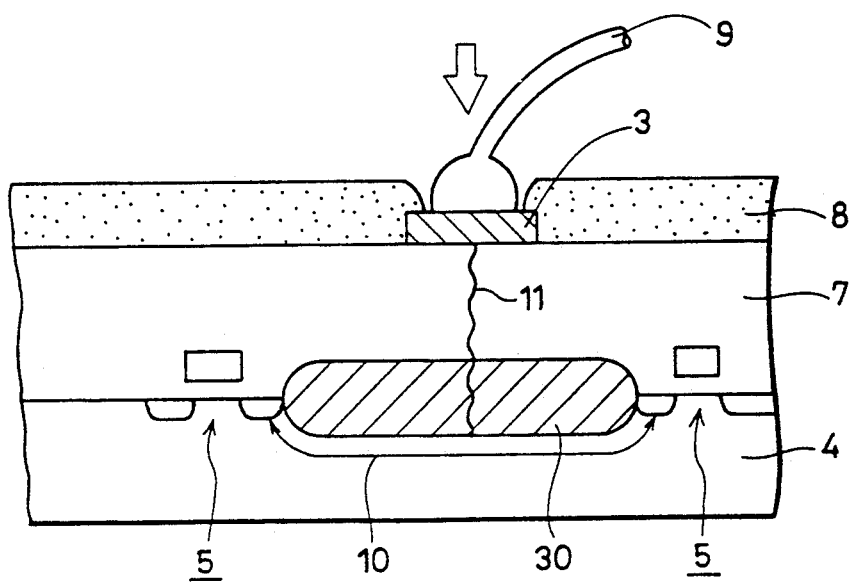
FIG. 12 is a diagram schematically showing sectional structure of a conventional semiconductor device taken along a cut line A—A in FIG. 11.
Figure 13:
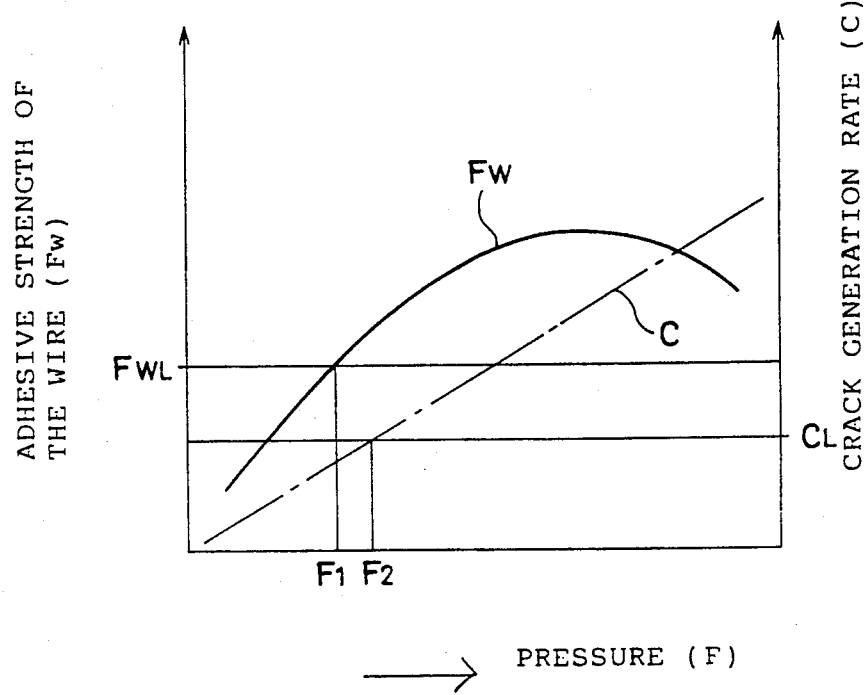
FIG. 13 is a diagram showing a correlation between bonding pressure, adhesive strength of a wire and a crack generation rate in a bonding step of a semiconductor device.

FIG. 10A is a sectional view showing a structure of a semiconductor device of a so-called tape carrier type which is in a bonding state. The solder bump 28 is previously formed in the bonding pad portion of the semiconductor chip 1. Then, the solder bump 28 after being positioned with a lead 29 patterned into polymeric film or the like, and the lead 29 are pressurized and bonded. Thereafter, a lead portion of a predetermined configuration is separated from the film, positioned with respect to a solder pattern 27 formed on a surface of the circuit substrate 26 with the lead attached to the semiconductor chip 1, and connected fixedly. FIG. 10B is a sectional view schematically showing a step of connecting the lead 29 formed in a polymeric film 31 and the solder bump 28 formed in the bonding pad portion 3 of the semiconductor chip 1. The film 31 and the semiconductor chip 1 are connected by pressure in a manner shown in the drawing. Accordingly, in this step the impact caused by the pressurized connection is exerted on the bonding pad portion 3. Accordingly, the underlying layer 12 provided under the bonding pad 3 acts effectively against this impact.

While, in the above described embodiment, the description states that the underlying layer 12 has a similar configuration having a slightly larger area than the bonding pad 3, it is not particularly limited to a similar configuration. In addition, a material of a bonding pad is not limited to Al, and such a semiconductor material as is capable of maintaining a good conductivity with an interconnection layer may be used. Furthermore, a composite film of a metallic layer and semiconductor material may be used.

As the foregoing, the semiconductor device according to the present invention has an underlying layer formed between a surface of a semiconductor substrate and a bonding pad and maintained in an electrically floating state with a surrounding conductor layer. As a result, the impact applied on the semiconductor substrate from the bonding pad in bonding can be buffered and generation of cracks or leak can be prevented, thereby improving yield in manufactures of semiconductor devices without losing reliability of interconnection layers with external leads to improve reliability of the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a major surface in which a plurality of semiconductor elements are formed;
   elements isolating means formed in the major surface of said semiconductor substrate for insulating and isolating said plurality of semiconductor elements;
   a bonding pad formed at a predetermined position above the major surface of said semiconductor substrate;
   an interlayer insulation layer provided between the bonding pad and the major surface of the semiconductor substrate; and
   an underlying layer of a material different from a material of said interlayer insulation layer, positioned between said bonding pad and the major surface of said semiconductor substrate in which said elements isolating means are located and covering at least a region under said bonding pad, to oppose cracking and leakage between the bonding pad and the substrate when the bonding pad is subjected to an externally imposed force during manufacture of the device.

2. A semiconductor device according to claim 1, further comprising:
   an insulation film disposed on the major surface of said semiconductor substrate, and wherein
   said elements isolating means comprises an electrode layer formed on said insulation film and positioned between respective impurity regions of adjacent semiconductor elements which are of a conductivity type different from that of said semiconductor substrate.

3. A semiconductor device according to claim 2, wherein:
   said electrode layer comprises opening portions in a region located below said bonding pad, and said underlying layer is located between said opening portions, with a periphery of the underlying layer surrounded by an insulation layer, said underlying layer being maintained in an electrically floating state during use of the device.

4. A semiconductor device according to claim 3, further comprising:
   impurity regions having the same conductivity type as that of said semiconductor substrate, located between said electrode layer and said underlying layer.

5. A semiconductor device according to claim 4, further comprising:
   a plurality of interlayer underlying layers which are stacked between said bonding pad and said underlying layer, adjacent interlayer underlying layers being separated by insulation layers.

6. A semiconductor device according to claim 5, wherein:
   one of said plurality of interlayer underlying layers is formed to be in contact with an under surface of said bonding pad.

7. A semiconductor device according to claim 4, wherein:
   said bonding pad comprises a plurality of stacked metal layers.

8. A semiconductor device according to claim 3, further comprising:
   a plurality of interlayer underlying layers stacked between said bonding pad and said underlying layer, with respective insulation layers disposed between adjacent ones of said interlayer underlying layers as well as said bonding pad and said underlying layer.

9. A semiconductor device according to claim 2, wherein:
   at least one underlying layer is formed between said bonding pad and said electrode layer.

10. A semiconductor device according to claim 9, wherein:
    said underlying layer comprises one of a polycrystalline silicon layer and a metal layer.

11. A semiconductor device according to claim 9, wherein:
    one of said at least one interlayer underlying layer is formed to be in contact with an under surface of said bonding pad.

12. A semiconductor device according to claim 9, wherein:
    said bonding pad is formed of a plurality of stacked metal layers.

13. A semiconductor device according to claim 1, wherein:
    said elements isolating means comprises a field oxide film formed on the major surface of the semiconductor substrate in a region located below said bonding pad.

14. A semiconductor device according to claim 13, wherein:
    said underlying layer comprises one of a polycrystalline silicon layer and a metal layer.

15. A semiconductor device according to claim 14, wherein:
    an additional underlying layer is formed to be in contact with a lower surface of said bonding pad.

16. A semiconductor device according to claim 14, wherein:

said bonding pad is formed of a plurality of stacked metal layers.

17. A semiconductor device, comprising:

a semiconductor chip in which integrated circuits are formed said semiconductor chip having a bonding pad portion;

a lead frame having a mounting portion for mounting said semiconductor chip and an external lead for enabling an electrical connection thereto;

a metal wire for connecting said bonding pad portion of said semiconductor chip and said external lead;

wherein said semiconductor chip further comprises a semiconductor substrate having a major surface in which a plurality of semiconductor elements are formed, elements isolating means for insulating and isolating between said plurality of semiconductor elements, the elements isolating means being formed in the major surface of said semiconductor substrate, a bonding pad formed at a predetermined position on the major surface of said semiconductor substrate through an interlayer insulation layer, an underlying layer formed of a material different from a material of said interlayer insulation layer, said underlying layer being positioned between said bonding pad and the major surface of said semiconductor substrate in which said elements isolating means is located, the underlying layer extending across at least a region under said bonding pad, to oppose cracking and leakage between the bonding pad and the substrate when the bonding pad is subjected to an externally imposed force during manufacture of the device.

18. A flip-chip type semiconductor device in which a bonding pad portion is disposed at a predetermined position on a major surface of a semiconductor substrate and is soldered directly into a circuit pattern on a circuit substrate and packed the semiconductor device comprising:

a semiconductor substrate having a major surface in which a plurality of semiconductor elements are formed;

a bonding pad being formed in a predetermined position on the major surface of said semiconductor substrate through an interlayer insulation layer;

elements isolating means formed in the major surface of said semiconductor substrate and located for insulating and isolating said plurality of semiconductor elements from each other and from said bonding pad an underlying layer of a material different from a material of said interlayer insulation layer, positioned between said bonding pad and the major surface of said semiconductor substrate in which said element isolating means is located, the underlying layer extending across at least a region under said bonding pad, to oppose cracking and leakage between the bonding pad and the substrate when the bonding pad is subjected to an externally imposed force during manufacture of the device.

19. A tape arrier type semiconductor device in which a bonding pad portion disposed at a predetermined position of a major surface of a semiconductor substrate is soldered and attached to a lead portion patterned into a resin tape with the lead portion thereafter cut into a predetermined ocnfiguration, soldered on a circuit substrate, and then packed, said semiconductor device comprising:

a semiconductor substrate having a major surface on which a plurality of semiconductor elements are formed;

element isolating means formed on the major surface of said semiconductor substrate and for insulating and isolating said plurality of semiconductor elements;

a bonding pad formed in a predetermined position on the major surface of said semiconductor substrate, with an interlayer insulation layer provided between said bonding pad and said major surface of said semiconductor substrate;

an underlying layer of a material different from a material of said interlayer insulation layer, positioned between said bonding pad and the major surface of said semiconductor substrate in which said element isolating means is located, the underlying layer extending across at least a region under said bonding pad.

* * * * *